United States Patent
Joachim et al.

[11] Patent Number: 6,127,215
[45] Date of Patent: Oct. 3, 2000

[54] DEEP PIVOT MASK FOR ENHANCED BURIED-CHANNEL PFET PERFORMANCE AND RELIABILITY

[75] Inventors: Hans-Oliver Joachim, Wappingers Falls; Jack A. Mandelman, Stormville; Rajesh Rengarajan, Poughkeepsie, all of N.Y.

[73] Assignees: International Business Machines Corp., Armonk, N.Y.; Siemens Microelectronics, Inc., Cupertino, Calif.

[21] Appl. No.: 09/181,964

[22] Filed: Oct. 29, 1998

[51] Int. Cl.[7] ........................ H01L 21/8238; H01L 21/76
[52] U.S. Cl. .......................... 438/224; 438/391; 438/421; 438/424; 438/427; 438/700; 438/701; 257/369; 257/374
[58] Field of Search ................................... 438/217, 218, 438/221, 223, 224, 427, 424, 391, 421, 444, 700, 701; 257/369, 374

[56] References Cited

U.S. PATENT DOCUMENTS

| | | |
|---|---|---|
| 3,136,897 | 6/1964 | Kaufman . |
| 4,660,068 | 4/1987 | Sakuma et al. . |
| 4,663,832 | 5/1987 | Jambotkar . |
| 4,842,675 | 6/1989 | Chapman et al. . |
| 4,868,136 | 9/1989 | Ravaglia . |
| 4,900,692 | 2/1990 | Robinson . |
| 5,436,488 | 7/1995 | Poon et al. . |
| 5,447,884 | 9/1995 | Fahey et al. . |
| 5,470,781 | 11/1995 | Chidambarrao et al. . |
| 5,578,518 | 11/1996 | Koike et al. . |
| 5,661,329 | 8/1997 | Hiramoto et al. . |
| 5,674,775 | 10/1997 | Ho et al. . |
| 5,677,231 | 10/1997 | Maniar et al. . |
| 5,858,866 | 1/1999 | Berry et al. ............................. 438/589 |
| 5,956,598 | 9/1999 | Haung et al. ........................... 438/424 |

FOREIGN PATENT DOCUMENTS

09/312429  11/1997  European Pat. Off. .

OTHER PUBLICATIONS

Geissler et al. "A new three–dimensional MOSFET gate–induced drain leakage effect in narrow deep submicron devices" IEEE, IEDM, pp. 839–842), Dec. 1991.

Park et al. "Corealation between gate oxide reliability and the profile of the trench top corner in Shallow Trench Isolation" IEEE, IEDM, pp. 747–750, Dec. 1996.

Wantanabe et al. "Corner–rounded shallow trench isolation technology to reduce the stress–induced tunnel oxide leakage current for highly reliable flash memories" IEEE, IEDM, pp. 833–836, Dec. 1996.

Narrow–Width Effects of Shallow Trench–Isolated CMOS with n+ –Polysilicon Gate, Ohe et al., IEEE Transactions on Electron Devices, Jun. 6, 1989, pp. 1110–1116.

High Reliability Trench Isolation Technology with Elevated Field Oxide Structure for Sub–Quarter Micron CMOS Devices, Ukeda et al., International Conference on Solid State Devices and Materials, Yokohama, 1996, pp. 260–262.

*Primary Examiner*—Charles Bowers
*Assistant Examiner*—Erik Kielin
*Attorney, Agent, or Firm*—McGinn & Gibb, P.C.; Daryl K. Neff, Esq.

[57] ABSTRACT

A semiconductor structure comprises first gate conductors which wrap around N-wells of buried-channel P-type metal oxide semiconductor field effect transistors and second gate conductors which do not wrap around P-wells of surface-channel N-type metal oxide semiconductor field effect transistors and a method of manufacturing the same comprises forming insulators adjacent each of the N-wells and the P-wells, protecting the N-wells with a patterned mask, forming first divots in areas of the insulators adjacent the N-wells and forming second divots in areas of the insulators adjacent P-wells, wherein the first divots have a greater depth than the second divots.

20 Claims, 5 Drawing Sheets

DEEP PIVOT MASK FOR ENHANCED BURIED-CHANNEL PFET PERFORMANCE AND RELIABILITY

BACKGROUND OF THE INVENTION

1. Field of the Invention

The present invention generally relates to controlling the amount of gate wrap-around within metal oxide semiconductor field effect transistors by adjusting the depth of divots within the shallow trench isolation regions adjacent the gates.

2. Description of the Related Art

It is well recognized that divots in shallow trench isolation (STI) regions adjacent transistor wells, which are a consequence of removing the sacrificial oxide layers in surface-channel N-type metal oxide semiconductor field effect transistors (NFET's), are responsible for causing the gate conductor to "wraparound" the silicon corners in NFET's which results in poor threshold voltage (Vt) controllability of the NFETs. Such divots 12, 13 are shown adjacent a buried-channel PFET device in FIG. 1. Because of this poor threshold voltage controllability, the doping concentration within the P-well beneath the gate conductor is increased in order to meet the target off-current (e.g., the drain-source current where the field effect transistor is off—"Ioff").

However, a problem exists with this conventional solution of increasing the doping concentration because a drastically increased array junction leakage has been observed with increased P-well surface concentration (e.g., a surface concentration greater than $5 \times 10^{17}$ cm$^{-3}$). Because of this array NFET problem arising from the STI divot, there has been great interest in minimizing divot depth.

The invention minimizes divot depth for NFET devices and at the same time avoids causing problems with other devices manufactured on the same wafer, such as buried-channel PFET devices.

SUMMARY OF THE INVENTION

It is, therefore, an object of the present invention to provide a method of forming, on a semiconductor substrate, first gate conductors which wrap around N-wells of buried-channel P-type metal oxide semiconductor field effect transistors and second gate conductors which do not wrap around P-wells of buried-channel N-type metal oxide semiconductor field effect transistors. The inventive method comprises forming insulators adjacent each of the N-wells and the P-wells, protecting the P-wells with a patterned mask, forming first divots in areas of the insulators adjacent the N-wells and forming second divots in areas of the insulators adjacent P-wells, wherein the first divots have a greater depth than the second divots.

The process of forming the first divots comprises etching the insulators from portions of sides of the N-wells and the process of forming the second divots maintains the insulators on sides of the P-wells.

The method also includes forming gate conductors over the N-wells and the P-wells, such that respective ones of the gate conductors cover a top surface of the P-wells and others of the gate conductors cover a top surface and side surfaces of the N-wells. Additionally, the N-wells have a depleted region within a surface P-layer and the first divots are formed to have a depth greater than a depth of the depleted region.

In another embodiment the method includes forming insulators adjacent each of the N-wells and the P-wells, protecting the N-wells with a patterned mask and leaving the P-wells exposed, implanting a first impurity in the P-wells, removing the first patterned mask, protecting the P-wells with a second patterned mask and leaving the N-wells exposed, implanting a second and third impurity in the N-wells, forming first divots in areas of the insulators adjacent the N-wells, removing the second patterned mask, and forming second divots in areas of the insulators adjacent the P-wells, wherein the first divots have a greater depth than the second divots.

The invention also comprises a semiconductor structure having buried-channel P-type metal oxide semiconductor field effect transistors having N-wells and first gate conductors covering tops and portions of sides of the N-wells, and surface-channel N-type metal oxide semiconductor field effect transistors having P-wells and second gate conductors covering tops of the P-wells.

The inventive structure also includes first shallow trench isolation (STI) regions adjacent the N-wells and having first divots, and second shallow trench isolation regions (STI) adjacent the P-wells and having second divots, wherein the first divots have a depth greater than that of the second divots. Also, the N-wells include a depleted P-type region adjacent the first gate conductors and the first gate conductors cover the sides of the N-wells to a depth greater than a depth of the depleted P-type region. Further, the N-wells and the P-wells are positioned on a single substrate.

The invention controls the amount of gate wrap-around within field effect transistors by adjusting the depth of divots within the shallow trench isolation regions adjacent the gates. The invention is a single process which forms a deep divot in buried-channel PFET devices and a shallow divot depth in surface-channel NFET devices on the same substrate and, by doing so, provides reduced sub-threshold swing, off-current, parasitic edge conduction, hot-electron degradation and sensitivity to the presence of charge adjacent to the device sidewall.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

As mentioned above, divots in shallow trench isolation (STI) regions adjacent transistor well regions, which are a consequence of removing the sacrificial oxide layers in metal oxide semiconductor field effect transistors are responsible for causing the gate conductor to wrap-around the silicon edge which results in poor threshold voltage (Vt)

controllability of array NFETs. Therefore, there has been great interest in minimizing the divot depth. Ideally, it is desired that the divots adjacent transistor well regions in surface-channel N-type NFETs have zero depth.

The present inventors have discovered that a shallow STI divot depth, which is necessary for controlling corner conduction in surface-channel NFETs, is detrimental to the operation of the buried-channel P-type metal oxide semiconductor field effect transistors (referred to herein as PMOSFETs or PFETs). Shallow STI divot depth results in poor Ioff gate control at the edge of the buried-channel PFET, making the PFET device susceptible to sidewall parasitic conduction, poor subthreshold slope and hot-electron degradation.

Figure 1:
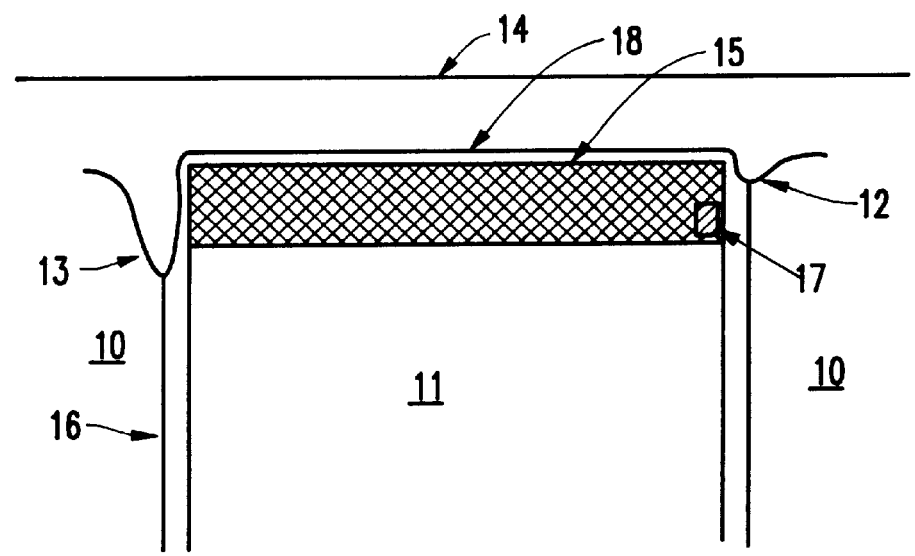
FIG. 1 is a schematic diagram of a cross-sectional view of the a P-type buried-channel field effect transistor.

FIG. 1 is a schematic drawing of a cross-section of a buried-channel PFET device having a deep divot 13 on its left side and a shallow divot 12 on its right side. Additionally, FIG. 1 illustrates a gate conductor 14 which, in this example, is an N+ polysilicon gate conductor, and a depleted P-layer 15 above an N-well 11 which is surrounded by a nitride layer 16. A gate oxide layer 18 separates the gate conductor 14 from the depleted region 15. The nitride layer 16 is bordered by shallow trench isolation (STI) regions 10.

Contrary to the effect on surface-channel NFETs, the shallow divot 12 results in parasitic edge conduction in the buried-channel PFET. Loss of gate control degrades sub-threshold slope, off-current and hot-electron reliability.

In order to assure acceptable off-current for the buried-channel PFET, the gate 14 must have strong enough control of the electric potential throughout the surface P-layer 15 such that the P-layer 15 is strongly depleted of majority carriers (holes). Gate wrap-around actually increases the control of the electric potential throughout the surface of the P-layer.

In the presence of the deep STI divot 13, the gate wrap-around of the corner allows the sidewall of the P-layer 15 to be fully depleted of holes. However with the shallow divot 12, the sidewall is weakly controlled by the gate 14. This results in high off-current and degraded sub-threshold slope.

Figure 2:
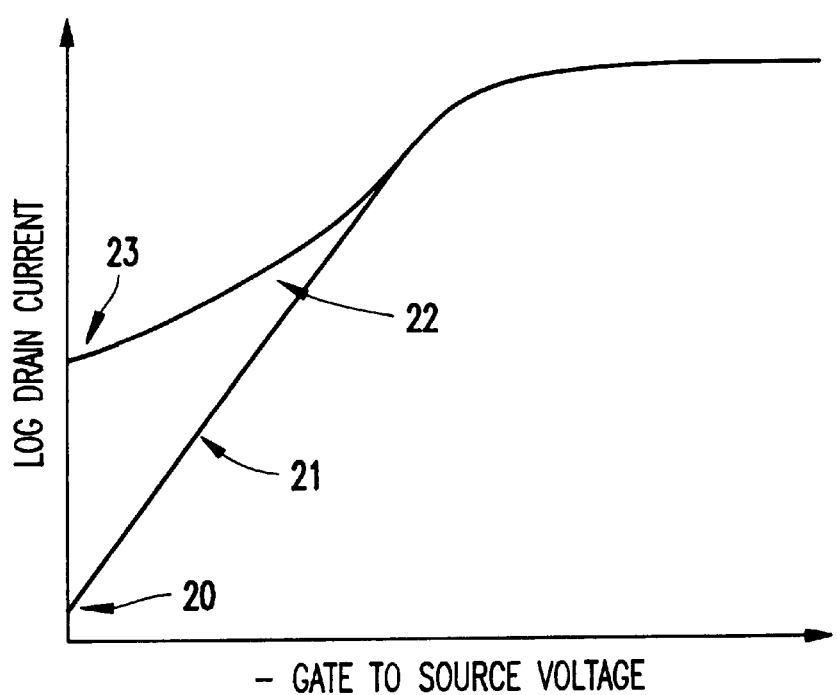
FIG. 2 is a graph showing the relationship between current and voltage for the different sides of the structure shown in FIG. 1.

FIG. 2 illustrates the voltage/current slope (e.g., the majority carrier depletion at the sidewalls) for the shallow divot 12 in line 22 and the voltage/current slope for the deep divot 13 in line 21. As shown in FIG. 2, the slope of line 22 produced by the shallow divot 12 is severely degraded from the more preferable slope of line 21 produced by the deep divot 13. Further, the deep divot 13 has a much lower off-current 20 than the undesirable elevated off-current 23 associated with the shallow divot 12.

The deep divot 13 has a depth that extends below the depth of the Player/N-well junction. Which allows the P-layer at the left hand side of the device to become completely depleted, making no contribution to off-current (ideally). The P-layer at the sidewall of right hand side of the device contains an undepleted region 17, since the gate is unable to control the potential in that part of the device. Thus, the right hand sidewall 17 contributes significantly to the elevated off-current.

Furthermore, since the top part of the nitride liner 16 is adjacent the sidewall P-layer 17 on the right hand side, any electrons which are trapped near the P-layer/nitride interface induce sidewall leakage. Trapped electrons may be process induced or may result from hot-electron degradation of the device during normal operation.

On the other hand, the nitride liner 16 on the left sidewall of the device is substantially recessed below the depth of the P-layer/N-well junction. This deep recess of the nitride liner 16 results in a significant reduction in trapped electron density in the region which is susceptible to parasitic conduction. The substantial absence of the nitride liner 16 significantly reduces the rate of hot-e degradation.

Preferred methods of the invention, which are described below, allow a deep divot to be fabricated on the PFETs and a shallow divot on the NFETs. The STI divot depth of the PFET may be tailored independently of the divot depth of the NFET. Thus, the invention controls the amount of gate wrap-around within MOSFETs by adjusting the depth of divots within the shallow trench isolation regions adjacent the gates.

Figure 3A:
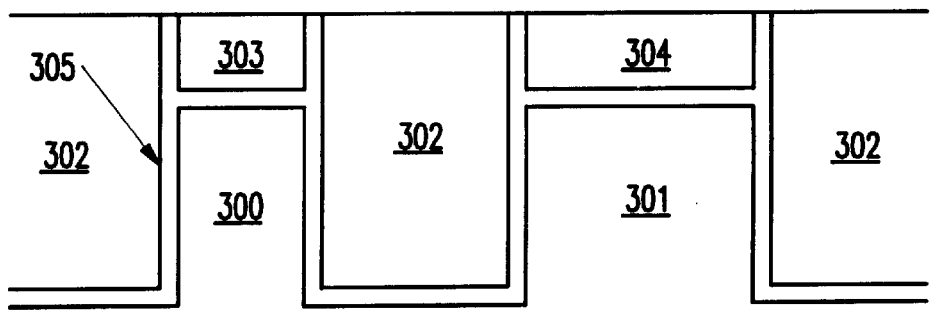
FIGS. 3A–3D are schematic diagrams of cross-sectional views of field effect transistors which demonstrate an embodiment of the invention.

More specifically, FIG. 3A illustrates a cross-section of a partially formed semiconductor transistor which includes a silicon region 300 which will become a P-well of an NFET and a silicon region 301 which will become an N-well of a PFET. FIG. 3A also illustrates shallow trench isolation (STI) regions 302 as well as nitride pads 303, 304 which exist above the NFET silicon region 300 and the PFET silicon region 301. In addition FIG. 3A illustrates a nitride liner 305.

Figure 5A:
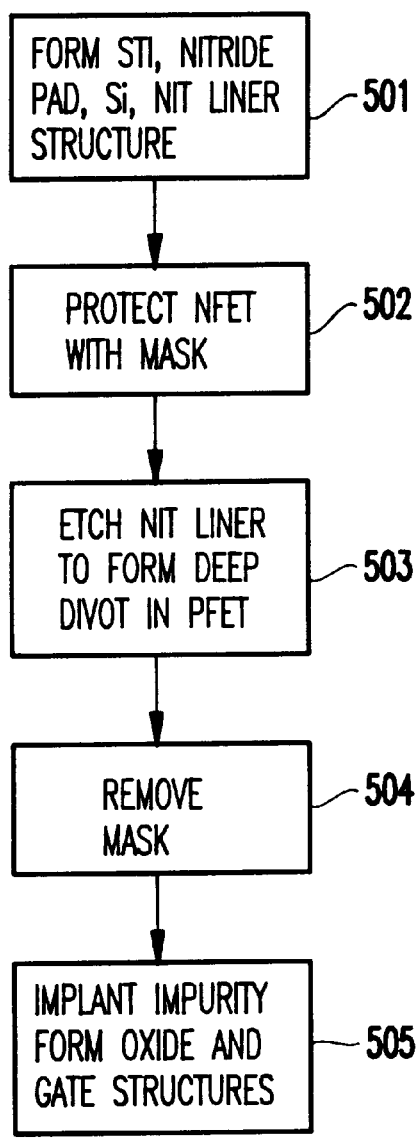
FIGS. 5A–5B are flowcharts illustrating preferred embodiments of the invention.

The structure illustrated in FIG. 3A is formed using well-known deposition and patterning methods. The flow-chart in FIG. 5A illustrates this portion of the invention in block 501. The structure is planarized using conventional methods, such as chemical-mechanical polishing, to smooth the structure down to the top of the pad nitride 303, 304.

Figure 3B:
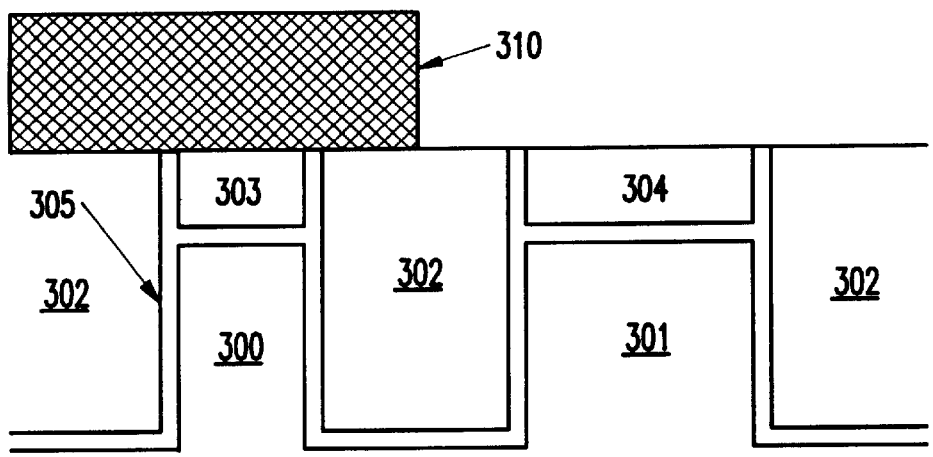

As shown in FIG. 3B, a layer of photoresist (or other similar masking material such as an oxide hard-masking layer) is deposited and patterned to form the WN mask (N-well mask) 310. This leaves the PFET areas 304, 301 exposed and the NFET 303, 300 areas protected by the photoresist 310. FIG. 5A illustrates this portion of the invention in block 502.

Figure 3C:
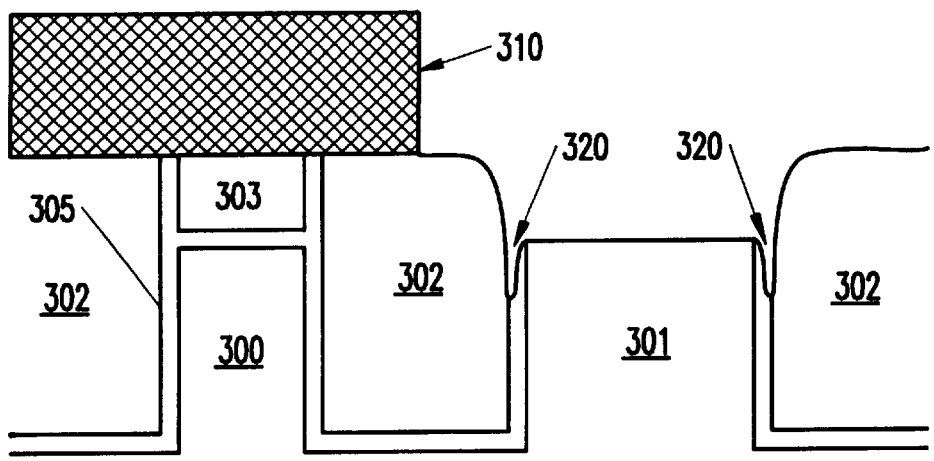

The exposed pad nitride layer 304 is removed using a common removal agent, such as a reactive ion etch for $Si_3N_4$ or hot $H_3PO_4$, as shown in FIG. 3C. The etch depth into the nitride liner 305 is determined by the length of time of the hot phosphoric etch. Typically, the $H_3PO_4$ etches at a rate equal to 4.5 nm/min, for a planar nitride surface. This information along with experimental tuning of the etch conditions is used to determine the etch time required to recess the nitride liner to its desired depth.

The nitride etch is followed by an oxide etch (such as buffered HF), which removes the thin (i.e. 6 nm) pad oxide which is commonly under the nitride pad 304. In most cases the nitride etch will also completely remove the thin pad oxide, due to the controlled overetch time. This etching produces pronounced divots 320 in the STI 302 which can easily be filled with gate conductor polysilicon (GC poly). FIG. 5A illustrates this portion of the invention in block 503.

The depth of the divot should be greater than the depth of the channel depletion layer to obtain good PFET performance. On the other hand, the depth of the divot in an NFET should be minimized, for the reasons discussed above. The divot depth for the NFET is preferably zero (no divot). However, more realistically, the divot depth for the NFET is less than one-third of the depth of the depleted region of the P-well such that the gate conductor does not significantly wrap-around the silicon edge of the P-well.

The channel depletion layer depth of a PFET is determined by the impurity (e.g., boron) implanting process. For example, the depletion layer commonly has a depth of approximately 600 angstroms and, in such a situation, the divot depth should be approximately 1000 angstroms to insure good PFET performance.

Figure 3D:
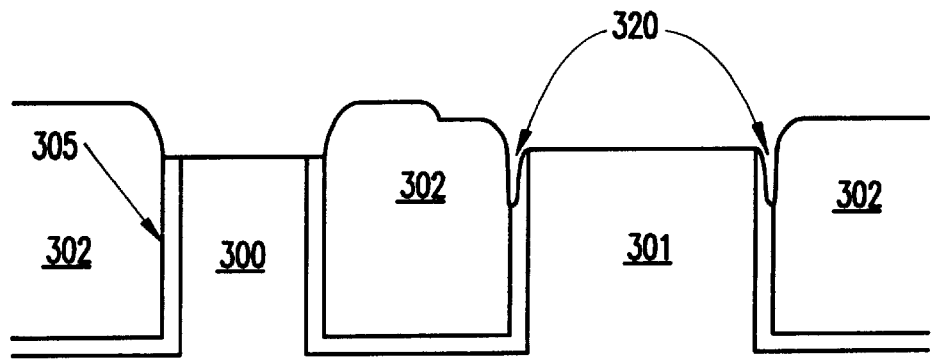

The deep divot masking photoresist 310 is then removed, as shown in FIG. 3D. FIG. 5A illustrates this portion of the invention in block 504. Then, the pad nitride 303 over the remaining areas 300 is removed (again, for example, using hot $H_3PO_4$). This also removes the pad oxide underlying the pad nitride 303. Since normally practiced pad etch conditions are used, the recess of the nitride liner 305 in the non-PFET (i.e. NFET) areas 300 is kept to a minimum.

Well known processes are used to complete the formation of the semiconductor transistors including sacrificial oxidation layer formation, well implant formation, gate oxidation layer formation, gate conductor deposition and patterning, and other steps well known to those ordinarily skilled in the art. FIG. 5A illustrates this portion of the invention in block 505.

Therefore, the invention selectively controls the divot depth for different types of transistors which are formed on the same substrate (e.g., wafer) in a single manufacturing process.

The invention is particularly useful for technologies using both buried-channel and surface-channel MOSFETs. In this application, buried-channel PMOSFETs and surface-channel NMOSFETs are used as an example. As discussed herein, buried-channel and surface-channel MOSFETs have competing needs for divot depth.

The foregoing embodiment of the invention adds an additional mask formation and removal step to the conventional process of manufacturing NMOSFETs and PMOSFETs. The second embodiment of the invention, discussed below, selectively controls the divot depth for different transistor devices without requiring additional mask formation or removal steps.

Figure 4A:
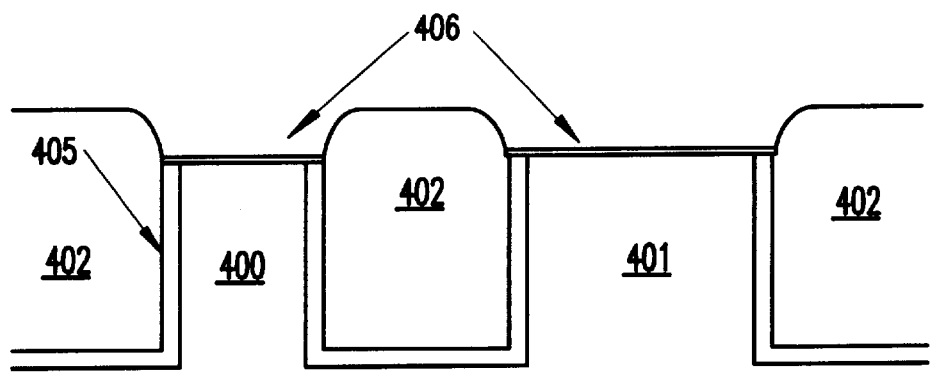
FIGS. 4A–4D are schematic diagrams of cross-sectional views of field effect transistors which demonstrate an embodiment of the invention.
Figure 4B:
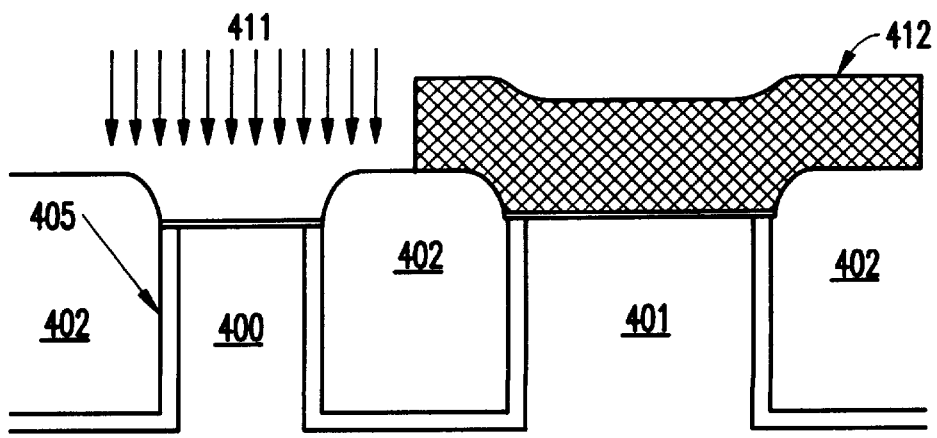
Figure 4C:
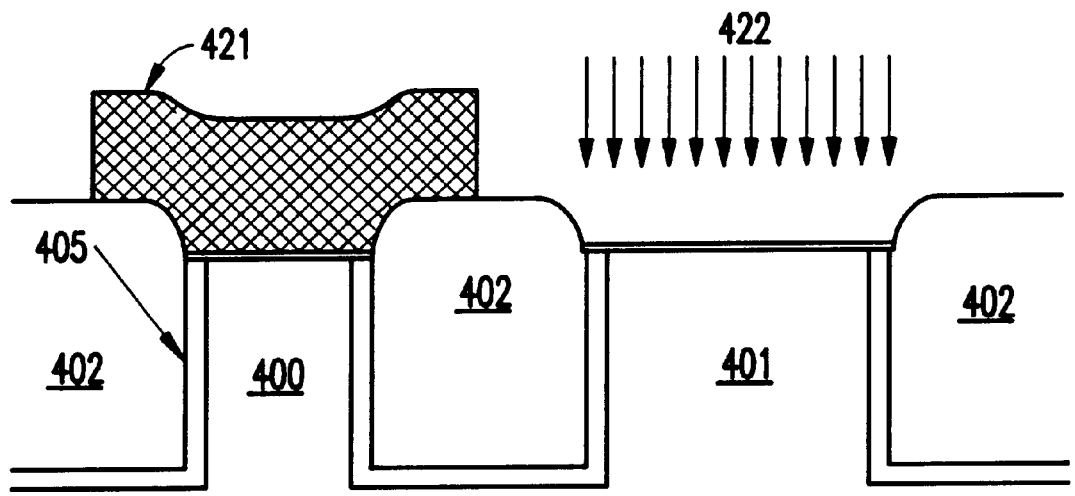
Figure 4D:
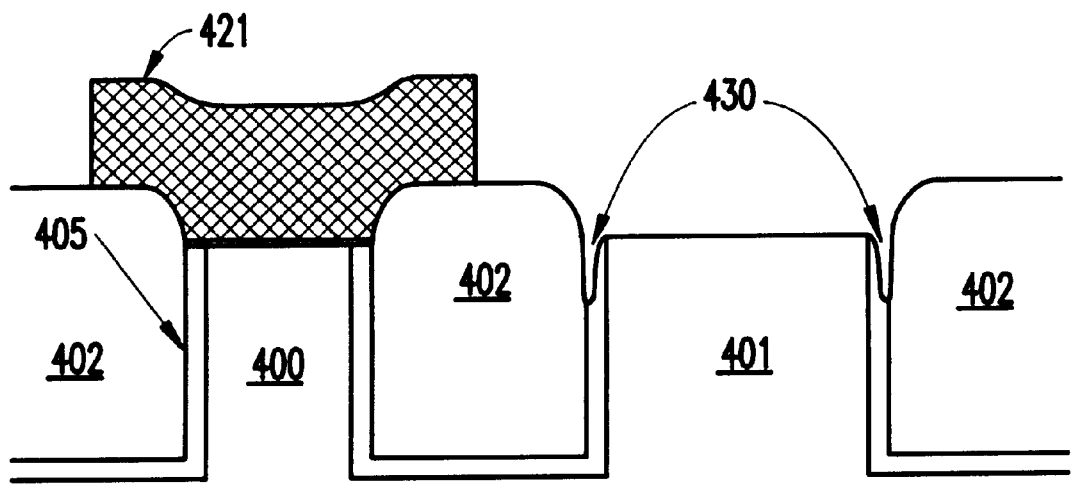
Figure 5B:
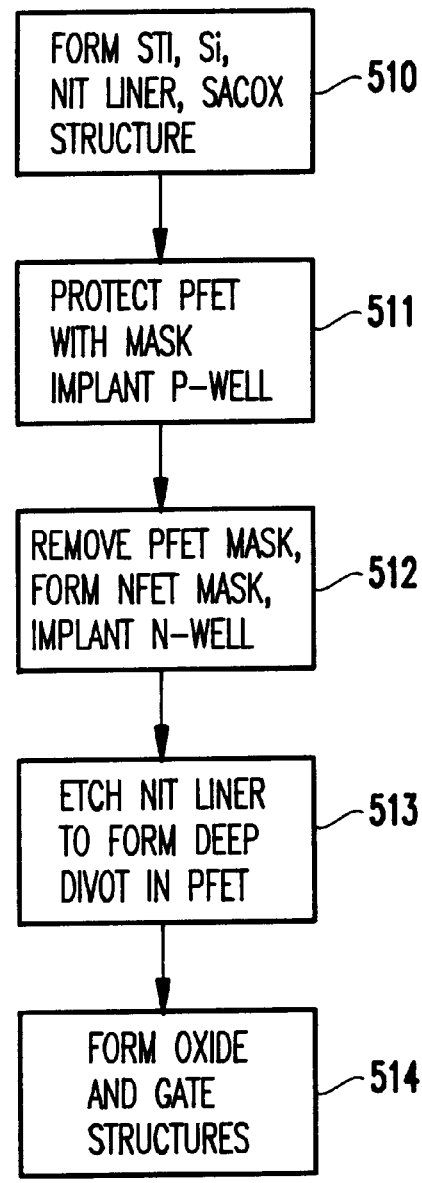

The second preferred method for accomplishing the invention is illustrated in FIGS. 4A–4D and FIG. 5B. FIG. 4A is similar to FIG. 3A and illustrates a silicon region to be used for an NFET 400, a silicon region to be used for a PFET 401, shallow trench isolation regions 402, a nitride liner 405 and a sacrificial oxide layer 406 grown on the exposed silicon surfaces 400, 401. FIG. 5B illustrates this portion of the invention in block 510.

As shown in FIG. 4B, a layer of photoresist is deposited and patterned to form the WP mask (P-well mask) 412. This leaves the NFET areas 400, 406 exposed and the PFET areas 401, 406 protected by the photoresist 412. A P-type impurity (such as boron) is implanted using methods well known to those ordinarily skilled in the art to establish the doping in the P-wells 400 of the NFETs. The flowchart in FIG. 5B illustrates this portion of the invention in block 511.

Referring to FIG. 4C, the P-well (WP) 412 photoresist is removed and another layer of photoresist is deposited and patterned as the WN (N-well) mask 421. This pattern protects the P-wells (NFETs) 400 from subsequent processing on the PFETs 401. The N-wells 401 are implanted with N-type dopants (such as phosphorus and arsenic) and a P-type dopant for the buried surface layer, again, using methods well known to those ordinarily skilled in the art. FIG. 5B illustrates this portion of the invention in block 512.

However, as shown in FIG. 4D, before the removal of the WN photoresist 421, an oxide etch (such as buffered HF) is performed to remove any sacrificial oxide covering the ends of the nitride liner 405 in the PFET areas 401. Then a nitride etch (again, such as hot $H_3PO_4$) is used to recess the exposed nitride liner 405 to the desired depth 430. As in the first embodiment, the etch depth into the nitride liner 405 is determined by the length of time of the hot phosphoric etch. FIG. 5B illustrates this portion of the invention in block 513.

Once a seam has been opened by the removal of the nitride liner 405, an oxide etch is used to expand the seam 430 in the PFET areas, while the NFETS remain protected by photoresist 421. This facilitates subsequent filling of the deep divot 430 with, for example, gate conductor polysilicon (GC poly). The N-well photoresist 421 is then removed, followed by the removal of the sacrificial oxide layer 406.

As with the previous embodiment, well known processes are used to complete the formation of the semiconductor transistors including gate oxide layer formation, gate conductor deposition and patterning, and other steps well known to those ordinarily skilled in the art. FIG. 5B illustrates this portion of the invention in block 514.

A low cost process modification for increasing the divot depth of the STI adjacent to the buried-channel PFETs, without affecting the NFETs, has been described. The invention controls the amount of gate wrap-around within MOSFETs by adjusting the depth of divots within the shallow trench isolation regions adjacent the gates. The invention includes a single process which forms a deep divot in buried-channel PFET devices and a shallow divot depth in the surface-channel NFET devices on the same substrate. By doing so, the invention provides reduced sub-threshold swing, off-current, parasitic edge conduction, electron degradation and sensitivity to the presence of charge adjacent to the device sidewall.

As discussed above, the invention relates to technologies using both buried-channel and surface-channel MOSFETs. For the buried-channel PFET, off-current and subthreshold swing are reduced, which results in lower standby power. Further, the increased gate wrap-around results in increased effective channel width, higher on-current and improved performance.

For the surface-channel NFET, divot depth is reduced. There is better Vt control and improved performance since nominal Vt may be set lower without exceeding a worst case off-current target.

While the invention has been described in terms of preferred embodiments, those skilled in the art will recognize that the invention can be practiced with modification within the spirit and scope of the appended claims.

What is claimed is:

1. A process of manufacturing semiconductor transistors comprising:

forming a plurality of transistor well regions separated by insulators, wherein said plurality of transistor well regions comprise first well regions and second well regions;

forming first divots in areas of said insulators adjacent said second well regions; and forming second divots in areas of said insulators adjacent said first well regions, wherein said first divots have a greater depth than said second divots.

2. The process in claim 1, wherein said forming transistor well regions comprises forming said first well regions as P-wells for surface-channel N-type metal oxide semiconductor field effect transistors and said second well regions as N-wells for buried-channel P-type metal oxide semiconductor field effect transistors.

3. The process in claim 1, wherein said forming transistor well regions comprises forming silicon well regions surrounded by nitride and separated by shallow trench insulators (STI).

4. The process in claim 1, wherein said forming said first divots comprises etching said insulators from portions of sides of said second well regions and said forming said second divots maintains said insulators on sides of said first well regions.

5. The process in claim 1, further comprising forming gate conductors over said transistor well regions, such that respective ones of said gate conductors cover a top surface of said first well regions and others of said gate conductors cover a top surface and side surfaces of said second well regions.

6. The process in claim 1, wherein said forming transistor well regions includes forming said second well regions to have a depleted region and said first divots are formed to have a depth greater than a depth of said depleted region.

7. A method of forming, on a semiconductor substrate, first gate conductors which wrap around corners of N-wells of buried-channel P-type metal oxide semiconductor field effect transistors and second gate conductors which do not wrap around P-wells of surface-channel N-type metal oxide semiconductor field effect transistors, said method comprising:

forming insulators adjacent each of said N-wells and said P-wells;

forming first divots in areas of said insulators adjacent said N-wells; and forming second divots in areas of said insulators adjacent P-wells, wherein said first divots have a greater depth than said second divots.

8. The process in claim 7, wherein said forming said first divots comprises etching said insulators from portions of sides of said N-wells and said forming said second divots maintains said insulators on sides of said P-wells.

9. The process in claim 7, further comprising forming gate conductors over said N-wells and said P-wells, such that respective ones of said gate conductors cover a top surface of said P-wells and others of said gate conductors cover a top surface and side surfaces of said N-wells.

10. The process in claim 7, wherein said N-wells have a depleted region and said first divots are formed to have a depth greater than a depth of said depleted region.

11. A process of manufacturing semiconductor transistors comprising:

forming a plurality of transistor well regions separated by insulators, wherein said plurality of transistor well regions comprise first well regions and second well regions;

protecting said first well regions with a first patterned mask and leaving said second well regions exposed;

implanting a first impurity in said second well regions;

removing said first patterned mask;

protecting said second well regions with a second patterned mask and leaving said first well regions exposed;

implanting a second and third impurity in said first well regions;

forming first divots in areas of said insulators adjacent said first well regions;

removing said second patterned mask; and forming second divots in areas of said insulators adjacent said second well regions, wherein said first divots have a greater depth than said second divots.

12. The process in claim 11, wherein said forming transistor well regions comprises forming said second well regions as P-wells for surface-channel N-type metal oxide semiconductor field effect transistors and said first well regions as N-wells for buried-channel P-type metal oxide semiconductor field effect transistors.

13. The process in claim 11, wherein said forming transistor well regions comprises forming silicon well regions surrounded by nitride and separated by shallow trench insulators (STI).

14. The process in claim 11, wherein said forming said first divots comprises etching said insulators from portions of sides of said first well regions and said forming said second divots maintains said insulators on sides of said second well regions.

15. The process in claim 11, further comprising forming gate conductors over said transistor well regions, such that respective ones of said gate conductors cover a top surface of said second well regions and others of said gate conductors cover a top surface and side surfaces of said first well regions.

16. The process in claim 11, wherein said forming transistor well regions includes forming said first well regions to have a depleted region and said first divots are formed to have a depth greater than a depth of said depleted region.

17. A method of forming, on a semiconductor substrate, first gate conductors which wrap around corners of N-wells of buried-channel P-type metal oxide semiconductor field effect transistors and second gate conductors which do not wrap around corners of P-wells of buried-channel N-type metal oxide semiconductor field effect transistors, said method comprising:

forming insulators adjacent each of said N-wells and said P-wells;

protecting said N-wells with a patterned mask and leaving said P-wells exposed;

implanting a first impurity in said P-wells;

removing said first patterned mask;

protecting said P-wells with a second patterned mask and leaving said N-wells exposed;

implanting a second and third impurity in said N-wells;

forming first divots in areas of said insulators adjacent said N-wells;

removing said second patterned mask;

forming second divots in areas of said insulators adjacent said P-wells, wherein said first divots have a greater depth than said second divots;

forming said first gate conductors over said N-wells and in said first divots; and forming said second gate conductors over said P-wells and in said second divots.

18. The process in claim 17, wherein said forming said first divots comprises etching said insulators from portions of sides of said N-wells and said forming said second divots maintains said insulators on sides of said P-wells.

19. The process in claim 17, wherein said second gate conductors cover a top surface of said P-wells said first gate conductors cover a top surface and side surfaces of said N-wells.

20. The process in claim 17, wherein said N-wells have a depleted region and said first divots are formed to have a depth greater than a depth of said depleted region.

* * * * *

UNITED STATES PATENT AND TRADEMARK OFFICE
CERTIFICATE OF CORRECTION

PATENT NO.   : 6,127,215
DATED        : October 3, 2000
INVENTOR(S)  : Joachim, Hans-Oliver, et al.

It is certified that error appears in the above-identified patent and that said Letters Patent is hereby corrected as shown below:

Please correct the title to read --DEEP DIVOT MASK FOR ENHANCED BURIED CHANNEL PFET PERFORMANCE AND RELIABILITY--.

Signed and Sealed this

Third Day of July, 2001

*Attest:*

*Attesting Officer*

NICHOLAS P. GODICI
*Acting Director of the United States Patent and Trademark Office*